(12) United States Patent
Wang et al.

(10) Patent No.: US 11,051,400 B2
(45) Date of Patent: Jun. 29, 2021

(54) CAMERA MODULE WITH COMPRESSION-MOLDED CIRCUIT BOARD AND MANUFACTURING METHOD THEREOF

(71) Applicant: NINGBO SUNNY OPOTECH CO., LTD., Zhejiang (CN)

(72) Inventors: Mingzhu Wang, Ningbo (CN); Nan Guo, Ningbo (CN); Feifan Chen, Ningbo (CN); Bojie Zhao, Ningbo (CN); Bo Peng, Ningbo (CN); Zhen Huang, Ningbo (CN)

(73) Assignee: Ningbo Sunny Opotech Co., Ltd., Zhejiang (CN)

( * ) Notice: Subject to any disclaimer, the term of this patent is extended or adjusted under 35 U.S.C. 154(b) by 0 days.

(21) Appl. No.: 15/057,078

(22) Filed: Feb. 29, 2016

(65) Prior Publication Data
US 2017/0245363 A1 Aug. 24, 2017

(30) Foreign Application Priority Data
Feb. 24, 2016 (CN) .......................... 201610102572.X

(51) Int. Cl.
| | |
|---|---|
| H05K 1/02 | (2006.01) |
| H05K 3/00 | (2006.01) |
| G02B 7/09 | (2021.01) |
| H04N 5/225 | (2006.01) |
| H05K 3/32 | (2006.01) |
| H05K 3/46 | (2006.01) |
| H05K 3/20 | (2006.01) |

(52) U.S. Cl.
CPC ............. *H05K 1/0298* (2013.01); *G02B 7/09* (2013.01); *H04N 5/2253* (2013.01); *H05K 3/0014* (2013.01); *H05K 3/32* (2013.01); *H05K 3/46* (2013.01); *H05K 3/0052* (2013.01); *H05K 3/0058* (2013.01); *H05K 3/20* (2013.01); *H05K 3/4673* (2013.01); *H05K 2201/09118* (2013.01); *H05K 2201/10121* (2013.01); *H05K 2201/2018* (2013.01)

(58) Field of Classification Search
CPC .......... H05K 1/0298; H05K 3/32; H05K 3/46; H05K 3/0052; H05K 2201/10121; H05K 3/4632; H04N 5/2253; H04N 5/2257; G02B 7/09
See application file for complete search history.

(56) References Cited

U.S. PATENT DOCUMENTS

| | | | | |
|---|---|---|---|---|
| 4,327,126 A * | 4/1982 | Ogden | ................... | H05K 3/022 205/187 |
| 5,144,534 A * | 9/1992 | Kober | ................... | H05K 3/4691 174/254 |
| 5,519,177 A * | 5/1996 | Wang | ................... | H05K 3/4661 174/259 |
| 5,748,448 A * | 5/1998 | Hokari | ................. | H04N 5/2253 174/541 |
| 6,465,742 B1 * | 10/2002 | Hiraoka | ................. | B82Y 20/00 174/255 |

(Continued)

*Primary Examiner* — Jason A Flohre
(74) *Attorney, Agent, or Firm* — Raymond Y. Chan; David and Raymond Patent Firm

(57) ABSTRACT

A camera module with compression-molded circuit board is manufactured by compression-molding that can obtain properties such as high flatness, ultra-thin, fine wiring width and high integration.

16 Claims, 3 Drawing Sheets

(56) References Cited

U.S. PATENT DOCUMENTS

| | | | | |
|---|---|---|---|---|
| 6,570,099 B1* | 5/2003 | Hirano | ............... | H01L 23/36 |
| | | | | 174/258 |
| 7,230,188 B1* | 6/2007 | En | ............... | C23C 18/1607 |
| | | | | 174/257 |
| 8,274,600 B2* | 9/2012 | Kim | ............... | H04N 5/2253 |
| | | | | 257/680 |
| 2001/0052425 A1* | 12/2001 | Andoh | ............... | H05K 3/4069 |
| | | | | 174/262 |
| 2004/0231151 A1* | 11/2004 | Nakatani | ............... | H05K 1/113 |
| | | | | 29/830 |
| 2007/0285555 A1* | 12/2007 | Chen | ............... | H04N 5/2253 |
| | | | | 348/340 |
| 2010/0025793 A1* | 2/2010 | Chang | ............... | H01L 27/14618 |
| | | | | 257/433 |
| 2010/0103296 A1* | 4/2010 | Nakagiri | ............... | H04N 5/2252 |
| | | | | 348/294 |
| 2011/0044679 A1* | 2/2011 | Yoshida | ............... | H04N 5/2253 |
| | | | | 396/133 |
| 2011/0154662 A1* | 6/2011 | Droz | ............... | G06K 19/072 |
| | | | | 29/846 |
| 2011/0194023 A1* | 8/2011 | Tam | ............... | H04N 5/2253 |
| | | | | 348/374 |
| 2013/0128106 A1* | 5/2013 | Tam | ............... | H04N 5/2253 |
| | | | | 348/374 |
| 2013/0340249 A1* | 12/2013 | Kanda | ............... | H05K 3/46 |
| | | | | 29/852 |
| 2014/0170797 A1* | 6/2014 | Ho | ............... | H01L 27/14618 |
| | | | | 438/65 |
| 2015/0062422 A1* | 3/2015 | Stern | ............... | H04N 5/2257 |
| | | | | 348/374 |
| 2015/0373238 A1* | 12/2015 | Tago | ............... | H04N 5/2257 |
| | | | | 348/374 |
| 2016/0120018 A1* | 4/2016 | Chang | ............... | H05K 1/0242 |
| | | | | 333/1 |
| 2016/0241763 A1* | 8/2016 | Jung | ............... | H04N 5/2257 |
| 2016/0362527 A1* | 12/2016 | Koes | ............... | C08J 5/24 |
| 2018/0020537 A1* | 1/2018 | Matsushima | ............... | H05K 3/323 |

* cited by examiner

CAMERA MODULE WITH COMPRESSION-MOLDED CIRCUIT BOARD AND MANUFACTURING METHOD THEREOF

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to camera module, and more particularly to a camera module with compression-molded circuit board and the manufacturing method thereof.

Description of Related Arts

With the rapid development of the technology and the improvement of peoples' living standard, more and more smart electronic device have been used in various field and daily life. The smart electronic device can be seen everywhere. The smart device comprises all kinds of electrical parts, optical products, wherein the camera module plays one of the most important role.

All smart devices are developed in the direction of being thinner and having higher performance. Accordingly, high-pixel, high quality imaging and ultra-thin become a demand of the camera module.

Conventional camera module, made by COB (Chip On Board) technology, usually comprises at least a rigid-flex board, a photosensitive chip, a lens holder, a driving motor, and an optical lens. All electrical and electronic parts are arranged on the surface of the circuit board without overlapping with each other. With the demand of high-pixel, high image quality and high performance, the number of electrical and electronic components on the circuit board is increasing, and the size of the chip is increasing for accepting more resistors, capacitors and driven parts, resulting that the overall size of the electrical and electronic components getting bigger and bigger, the difficulty in assemble being more and more, and the size of the camera module being bigger and bigger too.

Smart phone, for example, is updating models from day to day, and the camera module is developed accordingly. The development of the smart phone is mainly focused in two directions. One is to provide more functions and more stable performance for the smart phone. The other is to improve the appearance and thickness of the smart phone. It is apparent that, the photoelectric properties of the camera module greatly affects its image quality, such as photo taking or video taking. On the other hand, according to the arrangement of the conventional smart phone, the camera module is parallelly installed in the smart phone, and therefore, the thickness of the camera module greatly affects and determines the thickness of the smart phone, while the projection area of the camera module substantially affects the width of the smart phone. One skilled in the art would find that the main factor that limits the ultra-thinness development of the smart phone is the camera module to be used. It is so difficult for the camera modules applied to the current smart phones to have a balanced coordination between good performance and compact overall size thereof.

It is apparent that, on the basis of conventional manufacturing and assembling technologies of the camera module, the requirements of the high performance and ultra-thinness in size of the camera module is irreconcilable contradiction.

The implementation of a camera module relies on all related factors. The photosensitive performance including the pixel and quality of the image taken by the camera module is related to the electrical and electronic components and optical elements. The size, shape, quality and other physical properties of the camera module is related to the manufacturing process, the assembly method, the manufacturing material to be used, and etc. How to more reasonably and appropriately manufacture and assemble more and more components to provide a camera module with outstanding performance like high-pixel, high image quality and etc., while fulfilling the requirement of lighter and thinner in size, is a problem remained to be solved.

SUMMARY OF THE PRESENT INVENTION

One object of the present invention is to provide a camera module with compression-molded circuit board, wherein the circuit board is manufactured using molding to minimize its size and to provide an integration structure, that is able to solve the contradiction between the configuration of the electrical and electronic components and the increased size of the circuit board.

Another object of the present invention is to provide a camera module with compression-molded circuit board, wherein molding method is used to obtain an innovative circuit board with high flatness, ultra-thin, highly integrated, and fine line width.

Another object of the present invention is to provide a camera module with compression-molded circuit board, wherein the circuit board is manufactured by using a compression-molding method, so that the circuit board structure is optimized and thus the camera module is optimized.

According to the present invention, the foregoing and other objects and advantages are attained by a camera module with compression-molded circuit board, which comprises a circuit and a circuit board body, wherein the circuit board body and the circuit are integrally manufactured by compression-molding method. The compression-molded circuit board is electrically connected with a light-sensitive sensor such as a photosensitive chip.

In one embodiment, the circuit board body is made of hot melting or hot setting material such as epoxy resin by means of compression-molding.

In one embodiment, the circuit board further comprises a reinforcing member, wherein the circuit board body is made based on the reinforcing member and formed by compressing hot melting or hot setting material such as laminated epoxy resin.

In one embodiment, the circuit board comprises one of the circuit board body or a plurality of the circuit board bodies, wherein the circuit board bodies are aligned with each other.

In one embodiment, the circuit board comprises 2 to 10 layers of circuit board body.

In one embodiment, the thickness of the circuit board body is 0.1 mm to 0.6 mm.

In one embodiment, a wiring width of the circuit of the compression-molded circuit board is 0.01 mm to 0.09 mm. One skilled in the art can understand that the above-mentioned layers, thickness and the wiring width is exemplary only and not intended to limit the present invention.

In accordance with another aspect of the invention, the present invention comprises a camera module which comprises an optical lens, a light-sensitive sensor such as a photosensitive chip and a circuit board, wherein the circuit board is manufactured by molding method. The photosensitive chip is electrically connected with the circuit board. The optical lens is provided in a photosensitive path of the photosensitive chip.

In accordance with another aspect of the invention, the present invention comprises a manufacturing method of a camera module, wherein the manufacturing method comprises the following steps: obtaining a circuit board by compression-molding; electrically connecting a photosensitive chip to the circuit board; and assembling an optical lens in a photosensitive path of the photosensitive chip.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

One skilled in the art can understand that in the detailed description of the present invention, the terminology used such as longitudinal, transverse, upper, lower, front, rear, left, right, vertical, horizontal, top, bottom, inner, outer and etc. are only to indicate the positional relationship according the orientation or positional relationship shown in the figures. It is only for the purpose the description, but not indicating that the device or the components must be manufactured or operated in a specific orientation, thus the above mentioned terms are not limitations of the present invention.

Figure 1:
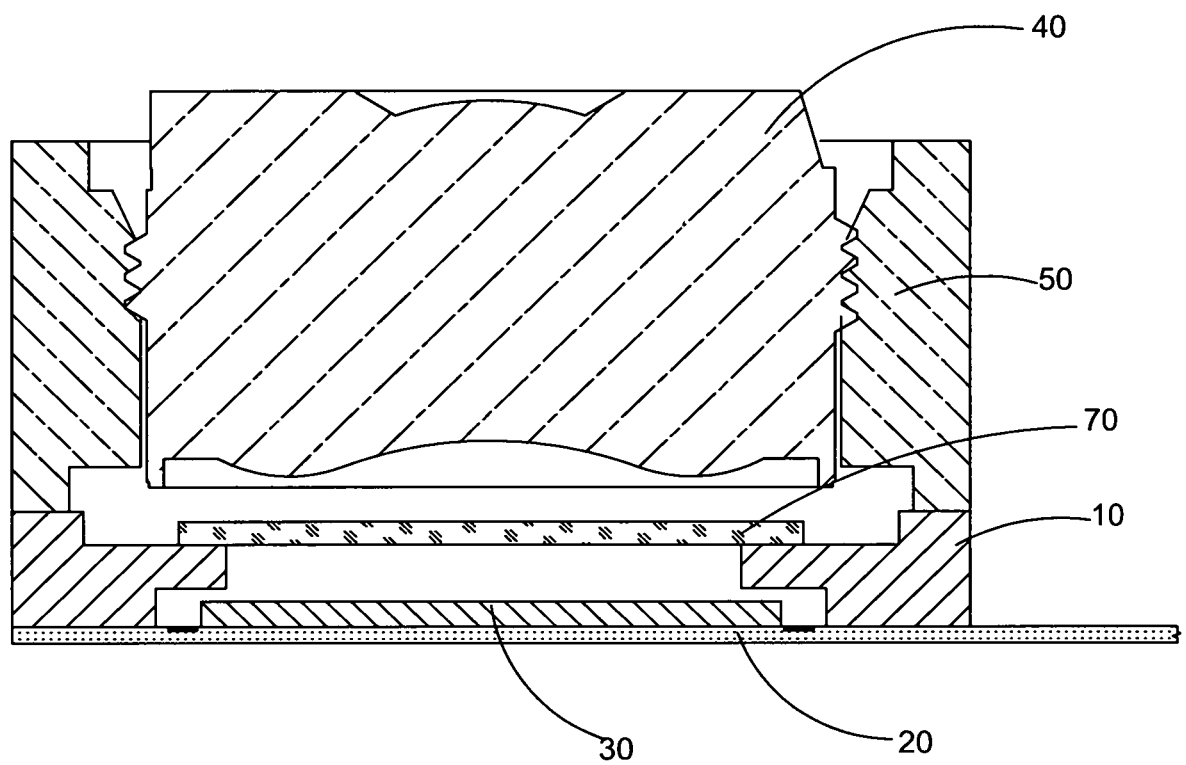
FIG. 1 illustrated a perspective view of a camera module according to a preferred embodiment of the present invention.
Figure 2:
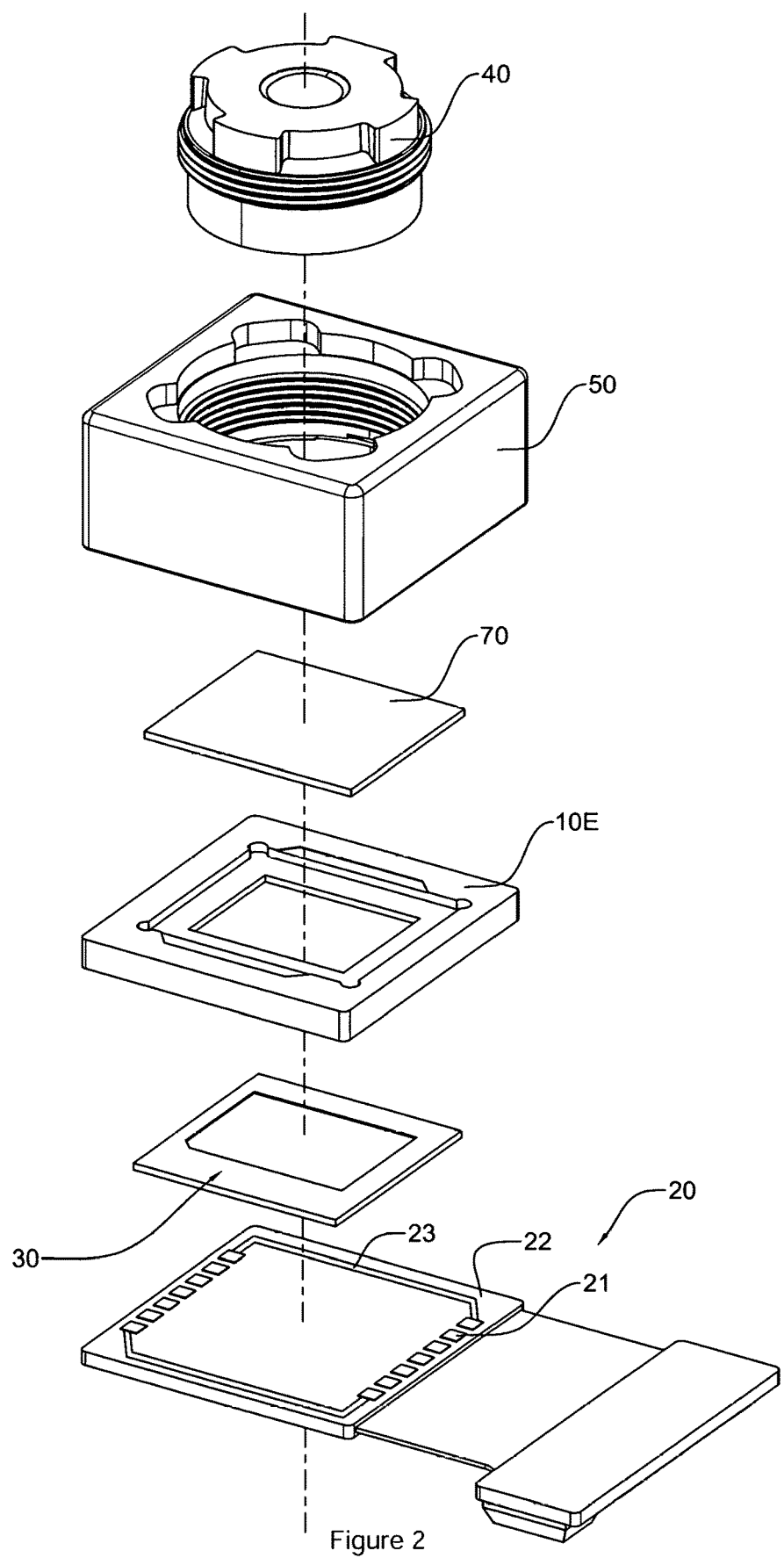
FIG. 2 illustrated an explosive view of the camera module according to the above mentioned preferred embodiment of the present invention.
Figure 3:
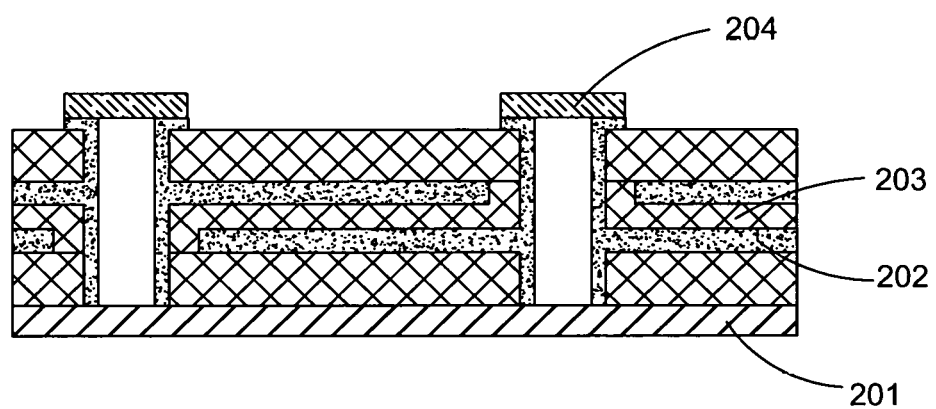
FIG. 3 illustrated a perspective view of the circuit board when being compression-molded according to the above mentioned preferred embodiment of the present invention.

Referring to FIGS. 1 to 3, a camera module according to a preferred embodiment of the present invention is illustrated. The camera module comprises a frame 10, a circuit board 20, a light-sensitive sensor such as a photosensitive chip 30, an optical lens 40, and a driver such as a motor 50. One skilled in the art can understand that without the motor 50, the camera module can be embodied as a fixed-focal camera module.

As shown in the figures, the photosensitive chip 30 is provided on the circuit board 20. The frame 10 is installed on the circuit board 20. The optical lens 40 is mounted on the motor 50 which is mounted on the frame 10. So that the optical lens 40 is supported and positioned above the circuit board 20 in such a manner that the emitting light traveling through the optical lens 40 can be sensed by, the photosensitive chip 30.

Specifically, the optical lens 40 is mounted on the motor 50, and can be driven by the motor for auto-focusing. The circuit board 20 and the motor 50 are provided on the opposite side of the frame 10 respectively, which makes the optical lens 40 located along a photosensitive path of the photosensitive chip 30. When the camera module is used to capture image of an object, the reflect light of the object can be processed by the optical lens 40 and further be accepted by the photosensitive chip 30 for photoelectric conversion.

The circuit board 20 comprises a plurality of circuit board conductive members 21, a circuit board body 22 and a circuit 23, wherein the plurality of circuit board conductive members 21 is provided on the circuit board body 22 for electrically connecting the light-sensitive chip 30. The circuit 23 is provided on the circuit board body 22.

Specifically, the light-sensitive chip 30 comprises a plurality of light-sensitive chip conductive members and a light-sensitive chip body, wherein the plurality of light-sensitive chip conductive members is provided on the light-sensitive chip body. The plurality of light-sensitive chip conductive members is used to electrically connect with the plurality of circuit board conductive members 21 of the circuit board 20, so as to further achieve the electrical connection of the light-sensitive chip 30 and the circuit board 20. Specifically, the light-sensitive chip and the circuit board are electrically connected using lead wire, soldering, ACP (anisotropic conductive paste) or hot-pressing method.

It is worth mentioning that, according to the present invention, the circuit board 20 is formed by compression-molding which is different from the conventional circuit board manufacturing method. More particularly, to manufacture the circuit board 20, layers of resin are laminated on a reinforced member 201 or copper board to form the circuit board body 22. In other words, the circuit board 21 is integrally formed by molding. During the molding process, different materials can be used for molding. In one embodiment of the present invention, it is preferably to use hot melting material or hot setting material such as epoxy resin. One skilled in the art can understand that the hot melting material or hot setting material such as epoxy resin is for exemplary only and not intended to limit the present invention.

More specifically, the compression-molded circuit board of the this embodiment manufactured by means of compression-molding. Specifically, electroplating circuit and film/resin film are added into the molding die. Then, resin material is filled, such as filling in resin powder or by injection. And finally close the mold and press to form the circuit board.

More specifically, in this preferred embodiment of the present invention, as shown in FIG. 3, a reinforcing plate 201 is provided on a molding die, and then a conductive member 202 is added together with a resin material 203 such as resin powder. Then the molding die is heated to a predetermined temperature. When the resin powder is melted with heat and becomes viscous fluid, under the effect of pressure, the viscous fluid of the resin material 203 flows and fills the inner cavity of the entire molding die. Then, while the temperature continues to increase, the resin material 203 is crosslinked and the molecular weight is increased, and further, the viscous fluid of the resin material 203 loses the flowability to become solid. The electrical components 204 such as resistors, capacitors and driven chip can further be mounted and connected with the conductive member 202 to form the circuit board 20.

It is appreciated that when the resin material 203 is added, it is also feasible to inject the melted resin material 203 into the molding die directly, and then by applying pressure and heat, the resin material 203 is solidified. It is also feasible to add a layer of conductive member 202 and a layer of resin material 203 repeatedly and overlappedly to form a multi-layer structure. The conductive member 202 and the electrical components 204 form the circuit 23 of the circuit board 20. The above mentioned electrical frame and the integral circuit board member can also be manufactured using the similar manufacturing method.

It is worth mentioning that the circuit board 21 manufactured by such molding method have advantages such as high flatness, ultra-thin, high integration, fine wire width, and etc., so that the contraction of configuration of the circuit parts and the increasing size of the circuit board can be solved. In one embodiment of the present invention, the circuit board body 22 manufactured by compression-molding as mentioned above have a good flatness. The wiring width could be 0.01 mm to 0.09 mm. The thickness of the circuit board 20 could be 0.1 mm to 0.6 mm. The layers of the circuit board could be 2 to 10 layers. One skilled in the art will understand that all figures mentioned above is exemplary only and not intended to be limiting.

It is worth mentioning, the frame 10 could be manufactured in all predetermined shape according to the demands. In other words, the circuit board 20 with the photosensitive chip 30 can be assembled with a conventional frame, and the frame 10 can be further installed with an optical filter 70.

In addition, the frame 10 can be manufactured using above mentioned compression-molding technology. In other words, the circuit board 20 and the frame 10 can be manufactured using laminated resin as an integral. In compression-molding, a recess could be provided on the top of the circuit board 20 for mounting the photosensitive chip 30 therein.

It is worth mentioning that the circuit board 20 with the photosensitive chip 30 can be assembled with different types of camera module such as fixed-focal camera module, auto-focus camera module or zooming camera module. And further connected with a control panel in a variety of electrical device through a flexible PCB. One skilled in the art will understand the circuit board 20 is exemplary only and not intended to be limit the present invention.

It is also worth mentioning, in the application of the circuit board 20, a single circuit board 20 can be manufactured independently to assemble together with other parts to constitute a camera module. A plurality of circuit boards 20 could be manufactured together using the above mentioned making method. That is forming an entire piece of the board with more than one piece of the circuit board 20 by compression-molding process, and then cut the entire board into several circuit boards 20. One skilled in the art will understand that the number of the circuit board 20 is exemplary only and not intended to be limiting.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A compression-molded circuit board of a camera module which comprises a light-sensitive chip comprising a light-sensitive chip body and a plurality of light-sensitive conductive members, being provided on top of the light-sensitive chip body, comprising:

at least one circuit board body which comprises a reinforcing plate and one or more laminated epoxy resin members being integrally compression-molded on said reinforcing plate by compression-molding;

an electroplating circuit, integrally provided on said at least one circuit board body, comprising one or more conductive members being molded on said reinforcing plate embedded in said one or more laminated epoxy resin members to form a multi-layer structure;

one or more electrical components mounted on said at least one circuit board body and connected with said one or more conductive members to form a circuit having a wiring width ranged from 0.01 mm to 0.09 mm; and a plurality of circuit board conductive members being provided on said at least one circuit board body and connected with said circuit provided on said at least one circuit board body to form said compression-molded circuit board having a thickness ranged from 0.1 mm to 0.6 mm, adapted for electrically connecting with the plurality of the light-sensitive conductive members of the light-sensitive chip;

wherein said compression-molded circuit board is formed integrally by compression-molding that said reinforcing plate is provided on a molding die while said electroplating circuit is added into the molding die, and then said circuit board conductive members is added together with an epoxy resin material into the molding die for flowing and filling an inner cavity of the molding die under an effective pressure, wherein while the temperature of the molding die is continuously increased until the epoxy resin material crosslinked and a molecular weight thereof increased, the epoxy resin material loses a flowability thereof and is solidified to form said one or more laminated epoxy resin members integrally compression-molded on said reinforcing plate in the multi-layer structure to form said circuit board body, thereafter said electrical components being mounted and connected with said conductive members to form said compression-molded circuit board in such a manner that, said one or more conductive members and said one or more laminated epoxy resin members are molded on said reinforcing plate in such a manner one inner layer of said one or more laminated epoxy resin members is laminated on said reinforcing plate, at least one layer of said one or more conductive members is laminated on said inner layer of said one or more laminated epoxy resin members, and then one outer layer of said one or more laminated epoxy resin members is laminated on said at least one layer of said one or more conductive members while another one or more of said one or more conductive members are transversely extending from said reinforcing plate to outside of said outer layer of said one or more laminated epoxy resin members to selectively connect with said one or more electrical components and said at least one layer of said one or more conductive members to form said circuit.

2. The compression-molded circuit board, as recited in claim 1, further comprising a recessed bracket integrally molded on said at least one circuit board body, adapted for an optical lens mounted on said bracket and located in an optical path of the light-sensitive chip.

3. A compression-molded circuit board of a camera module which comprises a light-sensitive chip comprising a light-sensitive chip body and a plurality of light-sensitive conductive members, being provided on top of the light-sensitive chip body, comprising:

at least one circuit board body which comprises a reinforcing plate and one or more laminated epoxy resin members being integrally compression-molded on said reinforcing plate by compression-molding;

an electroplating circuit, integrally provided on said at least one circuit board body, comprising one or more conductive members being molded on said reinforcing plate embedded in said one or more laminated epoxy resin members to form a multi-layer structure;

one or more electrical components mounted on said at least one circuit board body and connected with said one or more conductive members to form a circuit having a wiring width ranged from 0.01 mm to 0.09 mm; and a plurality of circuit board conductive members being provided on said at least one circuit board body and connected with said circuit provided on said at least one circuit board body to form said compression-molded circuit board having a thickness ranged from 0.1 mm to 0.6 mm, adapted for electrically connecting with the plurality of the light-sensitive conductive members of the light-sensitive chip;

wherein said compression-molded circuit board is formed integrally by compression-molding that said reinforcing plate is provided on a molding die while said electroplating circuit is added into the molding die, and then said circuit board conductive members is added together with an epoxy resin material into the molding die for flowing and filling an inner cavity of the molding die under an effective pressure, wherein while the temperature of the molding die is continuously increased until the epoxy resin material crosslinked and a molecular weight thereof increased, the epoxy resin material loses a flowability thereof and is solidified to form said one or more laminated epoxy resin members integrally compression-molded on said reinforcing plate in the multi-layer structure to form said circuit board body, thereafter said electrical components being mounted and connected with said conductive members to form said compression-molded circuit board, wherein said one or more conductive members and said one or more laminated epoxy resin members are molded on said reinforcing plate in such a manner that one outer layer of said one or more laminated epoxy resin members, one inner layer of said one or more laminated epoxy resin members are laminated on said reinforcing plate, two or more said layers of said one or more conductive members are laminated between said inner layer of said one or more laminated epoxy resin members and said outer layer of said one or more laminated epoxy resin members, and at least one middle layer of said one or more laminated epoxy resin members are laminated between each two layers of said one or more conductive members while one or more of said one or more conductive members are transversely extending from said reinforcing plate to outside of said outer layer of said laminated epoxy resin member to connect with said two or more layers of said one or more conductive members and said one or more electrical components respectively to form said circuit.

4. A camera module, comprising:
a compression-molded circuit board, which comprises:
at least one circuit board body which comprises a reinforcing plate and one or more laminated epoxy resin members being integrally compression-molded on said reinforcing plate by compression-molding;

an electroplating circuit, integrally provided on said at least one circuit board body, comprising one or more conductive members molded on said reinforcing plate embedded in said one or more laminated epoxy resin members to form a multi-layer structure;

one or more electrical components mounted on said at least one circuit board body and connected with said one or more conductive members to form a circuit having a wiring width ranged from 0.01 mm to 0.09 mm; and a plurality of circuit board conductive members provided on said at least one circuit board body and connected with said circuit provided on said at least one circuit board body to form said compression-molded circuit board having a thickness ranged from 0.1 mm to 0.6 mm, wherein said compression-molded circuit board is formed integrally by compression-molding that said reinforcing plate is provided on a molding die while said electroplating circuit is added into the molding die, and then said circuit board conductive members is added together with an epoxy resin material into the molding die for flowing and filling an inner cavity of the molding die under an effective pressure, wherein while the temperature of the molding die is continuously increased until the epoxy resin material cross-linked and a molecular weight thereof increased, the epoxy resin material loses a flowability thereof and is solidified to form said one or more laminated epoxy resin members integrally compression-molded on said reinforcing plate in the multi-layer structure to form said circuit board body, thereafter said electrical components being mounted and connected with said conductive members to form said compression-molded circuit board;

a light-sensitive chip, having an optical path, being mounted on top of said compression-molded circuit board, wherein said light-sensitive chip comprises a plurality of light-sensitive conductive members electrically connected with said plurality of circuit board conductive members of said compression-molded circuit board; and an optical lens supported above said compression-molded circuit board and located in said optical path of said light-sensitive chip such that an incoming light is able to pass through said optical lens and be accepted by said light-sensitive chip.

5. The camera module, as recited in claim 4, further comprising a recessed bracket integrally molded on said compression-molded circuit board and positioned around said light-sensitive chip, wherein said optical lens is supported on said bracket.

6. The camera module, as recited in claim 5, further comprising a motor mounted on said recessed bracket, wherein said optical lens is mounted on said motor such that said compression-molded circuit board and said motor are provided on two opposite sides of said bracket respectively and said optical lens is able to be driven by said motor for auto-focusing.

7. The camera module, as recited in claim 5, wherein said circuit board body and said circuit are molded into an integral structure by compression molding for supporting the light-sensitive chip of the camera module thereon, wherein said one or more laminated epoxy resin members of said circuit board body is formed by a resin material which is solidified from a viscous fluid of said resin material and integrally molded with said circuit.

8. The camera module, as recited in claim 7, wherein said one or more conductive members and said one or more laminated epoxy resin members are molded on said reinforcing plate in such a manner one inner layer of said one or more laminated epoxy resin members is laminated on said reinforcing plate, at least one layer of said one or more conductive members is laminated on said inner layer of said one or more laminated epoxy resin members, and then one outer layer of said one or more laminated epoxy resin members is laminated on said at least one layer of said one or more conductive members while another one or more of said one or more conductive members are transversely extending from said reinforcing plate to outside of said outer layer of said one or more laminated epoxy resin members to selectively connect with said one or more electrical components and said at least one layer of said one or more conductive members to form said circuit.

9. The camera module, as recited in claim 7, wherein said one or more conductive members and said one or more laminated epoxy resin members are molded on said reinforcing plate in such a manner that one outer layer of said one or more laminated epoxy resin members, one inner layer of said one or more laminated epoxy resin members are laminated on said reinforcing plate, two or more said layers of said one or more conductive members are laminated between said inner layer of said one or more laminated epoxy resin members and said outer layer of said one or more laminated epoxy resin members, and at least one middle layer of said one or more laminated epoxy resin members are laminated between each two layers of said one or more conductive members while one or more of said one or more conductive members are transversely extending from said reinforcing plate to outside of said outer layer of said laminated epoxy resin member to connect with said two or more layers of said one or more conductive members and said one or more electrical components respectively to form said circuit.

10. The camera module, as recited in claim 5, wherein said one or more conductive members and said one or more laminated epoxy resin members are molded on said reinforcing plate in such a manner one inner layer of said one or more laminated epoxy resin members is laminated on said reinforcing plate, at least one layer of said one or more conductive members is laminated on said inner layer of said one or more laminated epoxy resin members, and then one outer layer of said one or more laminated epoxy resin members is laminated on said at least one layer of said one or more conductive members while another one or more of said one or more conductive members are transversely extending from said reinforcing plate to outside of said outer layer of said one or more laminated epoxy resin members to selectively connect with said one or more electrical components and said at least one layer of said one or more conductive members to form said circuit.

11. The camera module, as recited in claim 5, wherein said one or more conductive members and said one or more laminated epoxy resin members are molded on said reinforcing plate in such a manner that one outer layer of said one or more laminated epoxy resin members, one inner layer of said one or more laminated epoxy resin members are laminated on said reinforcing plate, two or more said layers of said one or more conductive members are laminated between said inner layer of said one or more laminated epoxy resin members and said outer layer of said one or more laminated epoxy resin members, and at least one middle layer of said one or more laminated epoxy resin members are laminated between each two layers of said one or more conductive members while one or more of said one or more conductive members are transversely extending from said reinforcing plate to outside of said outer layer of said laminated epoxy resin member to connect with said two or more layers of said one or more conductive members and said one or more electrical components respectively to form said circuit.

12. The camera module, as recited in claim 4, wherein said circuit board body and said circuit are molded into an integral structure by compression molding to support said light-sensitive chip thereon, wherein said one or more laminated epoxy resin members of said circuit board body are formed by the epoxy resin material which is solidified from a viscous fluid of said resin material and integrally molded with said circuit.

13. The camera module, as recited in claim 12, wherein said one or more conductive members and said one or more laminated epoxy resin members are molded on said reinforcing plate in such a manner one inner layer of said one or more laminated epoxy resin members is laminated on said reinforcing plate, at least one layer of said one or more conductive members is laminated on said inner layer of said one or more laminated epoxy resin members, and then one outer layer of said one or more laminated epoxy resin members is laminated on said at least one layer of said one or more conductive members while another one or more of said one or more conductive members are transversely extending from said reinforcing plate to outside of said outer layer of said one or more laminated epoxy resin members to selectively connect with said one or more electrical components and said at least one layer of said one or more conductive members to form said circuit.

14. The camera module, as recited in claim 12, wherein said one or more conductive members and said one or more laminated epoxy resin members are molded on said reinforcing plate in such a manner that one outer layer of said one or more laminated epoxy resin members, one inner layer of said one or more laminated epoxy resin members are laminated on said reinforcing plate, two or more said layers of said one or more conductive members are laminated between said inner layer of said one or more laminated epoxy resin members and said outer layer of said one or more laminated epoxy resin members, and at least one middle layer of said one or more laminated epoxy resin members are laminated between each two layers of said one or more conductive members while one or more of said one or more conductive members are transversely extending from said reinforcing plate to outside of said outer layer of said laminated epoxy resin member to connect with said two or more layers of said one or more conductive members and said one or more electrical components respectively to form said circuit.

15. The camera module, as recited in claim 4, wherein said one or more conductive members and said one or more laminated epoxy resin members are molded on said reinforcing plate in such a manner one inner layer of said one or more laminated epoxy resin members is laminated on said reinforcing plate, at least one layer of said one or more conductive members is laminated on said inner layer of said one or more laminated epoxy resin members, and then one outer layer of said one or more laminated epoxy resin members is laminated on said at least one layer of said one or more conductive members while another one or more of said one or more conductive members are transversely extending from said reinforcing plate to outside of said outer layer of said one or more laminated epoxy resin members to selectively connect with said one or more electrical components and said at least one layer of said one or more conductive members to form said circuit.

16. The camera module, as recited in claim 4, wherein said one or more conductive members and said one or more laminated epoxy resin members are molded on said reinforcing plate in such a manner that one outer layer of said one or more laminated epoxy resin members, one inner layer of said one or more laminated epoxy resin members are laminated on said reinforcing plate, two or more said layers of said one or more conductive members are laminated between said inner layer of said one or more laminated epoxy resin members and said outer layer of said one or more laminated epoxy resin members, and at least one middle layer of said one or more laminated epoxy resin members are laminated between each two layers of said one or more conductive members while one or more of said one or more conductive members are transversely extending from said reinforcing plate to outside of said outer layer of said laminated epoxy resin member to connect with said two or more layers of said one or more conductive members and said one or more electrical components respectively to form said circuit.

* * * * *